(12) United States Patent
Blanchard et al.

(10) Patent No.: US 11,691,184 B2
(45) Date of Patent: Jul. 4, 2023

(54) SYSTEM AND TOOL FOR CLEANING A GLASS SURFACE OF AN ACCELERATOR COLUMN

(71) Applicant: Varian Semiconductor Equipment Associates, Inc., Gloucester, MA (US)

(72) Inventors: Michael J. Blanchard, Marblehead, MA (US); Nevin H. Clay, Boxford, MA (US); Joshua R. Conahan, Haverhill, MA (US); Christopher Lupoli, Exeter, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 474 days.

(21) Appl. No.: 17/007,044

(22) Filed: Aug. 31, 2020

(65) Prior Publication Data

US 2020/0391251 A1 Dec. 17, 2020

Related U.S. Application Data

(62) Division of application No. 15/489,133, filed on Apr. 17, 2017, now Pat. No. 10,780,459.

(51) Int. Cl.
| | |
|---|---|
| *B08B 9/00* | (2006.01) |
| *B08B 1/00* | (2006.01) |
| *A47L 13/16* | (2006.01) |
| *A47L 13/46* | (2006.01) |
| *H01J 37/317* | (2006.01) |
| *B08B 1/04* | (2006.01) |
| *B08B 5/04* | (2006.01) |

(52) U.S. Cl.
CPC .............. *B08B 1/005* (2013.01); *A47L 13/16* (2013.01); *A47L 13/46* (2013.01); *B08B 1/00* (2013.01); *H01J 37/3171* (2013.01); *B08B 1/04* (2013.01); *B08B 5/04* (2013.01); *H01J 2237/022* (2013.01)

(58) Field of Classification Search
None
See application file for complete search history.

(56) References Cited

U.S. PATENT DOCUMENTS

| | | | |
|---|---|---|---|
| 3,142,855 A | 8/1964 | Gilchrist | |
| 3,317,944 A | 5/1967 | Napier | |
| 6,202,247 B1 * | 3/2001 | Lorenz, Jr. | A46B 7/026 15/118 |
| 2004/0177460 A1 | 9/2004 | Wagner | |
| 2009/0101834 A1 * | 4/2009 | Spraggon | H01J 37/08 250/492.21 |
| 2009/0217482 A1 * | 9/2009 | Miyanaga | B08B 9/00 15/383 |

(Continued)

FOREIGN PATENT DOCUMENTS

JP 2005214908 A 8/2005

*Primary Examiner* — Mikhail Kornakov
*Assistant Examiner* — Ryan L Coleman
(74) *Attorney, Agent, or Firm* — KDW Firm PLLC

(57) ABSTRACT

A cleaning tool for cleaning a glass surface of an accelerator column is disclosed. The cleaning tool includes a shaft including a first end and a second end; a foam body located at the first end of the shaft; and a mounting bracket coupled to the first end of the shaft, the mounting bracket receiving the foam body. An outer circumference of the foam body includes a textured cleaning surface for contacting the glass surface of the accelerator column.

11 Claims, 6 Drawing Sheets

(56) References Cited

U.S. PATENT DOCUMENTS

| | | | |
|---|---|---|---|
| 2012/0196428 A1* | 8/2012 | Asai | H01L 21/265 257/E21.334 |
| 2016/0102606 A1* | 4/2016 | Thompson | F02B 77/04 134/23 |

* cited by examiner

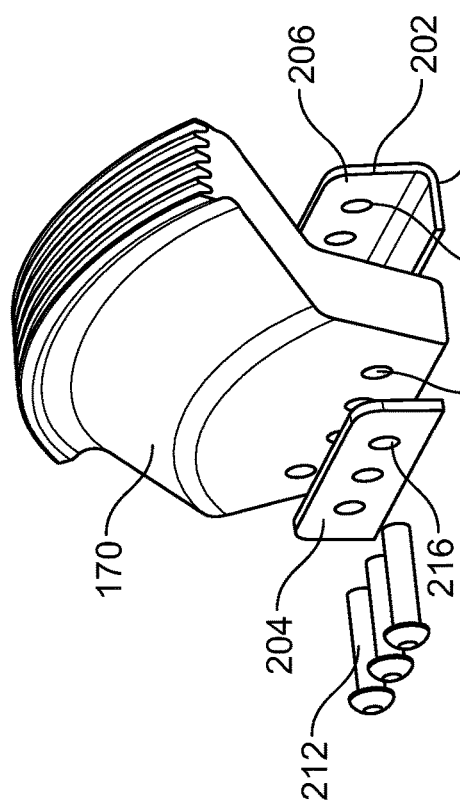
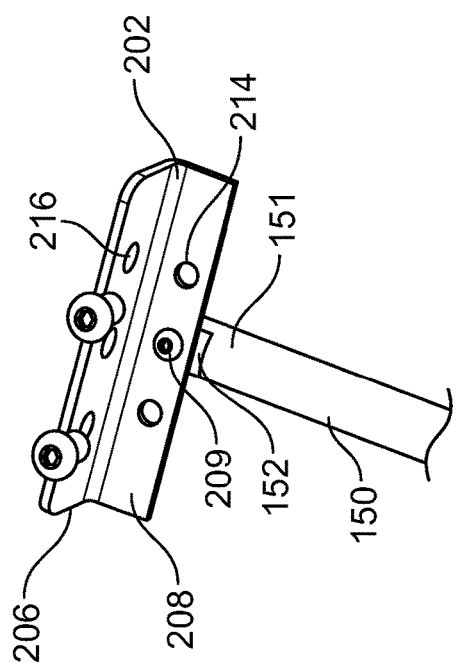
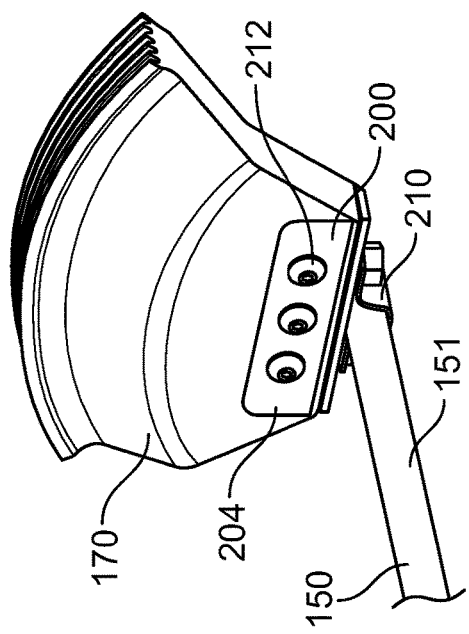
FIG. 4A
FIG. 4B
FIG. 4C
FIG. 4D

SYSTEM AND TOOL FOR CLEANING A GLASS SURFACE OF AN ACCELERATOR COLUMN

CROSS-REFERENCE TO RELATED APPLICATION

This application claims priority to and is a divisional application of U.S. Non-Provisional patent application Ser. No. 15/489,133, filed on Apr. 17, 2017, entitled "SYSTEM AND TOOL FOR CLEANING A GLASS SURFACE OF AN ACCELERATOR COLUMN," which is incorporated herein by reference in its entirety.

FIELD

The present embodiments relate to a cleaning tool for cleaning an inside surface in beamline ion implanters, and more particularly to a cleaning tool for cleaning the hard to reach glass surface between adjacent electrodes in an accelerator column.

BACKGROUND

In the present day, beamline ion implanters employ multiple components to direct an ion beam from an ion source to a substrate. To properly treat a substrate, the ion beam may be accelerated to a target ion energy, and may have its trajectory and shape manipulated by various beamline components to produce a set of target characteristics of the ion beam at the substrate. In many types of ion implanters, including medium energy and high energy ion implanters, an accelerator column(s) may be employed to accelerate or decelerate an ion beam to generate a target beam energy. A given accelerator column may include many electrodes arranged in electrical series fashion to accelerate an ion beam. For example, an accelerator column may include multiple electrodes having apertures to conduct the ion beam and arranged to increase a beam energy by applying a series of different potentials to the different electrodes. In this manner, the ion beam is accelerated according to the different potentials applied to the electrodes.

During use, contamination (e.g., particles) may accumulate within the accelerator column, especially along a glass surface in-between electrodes (e.g., titanium electrodes). Depending upon the particular design capabilities for an apparatus, such as a targeted maximum beam energy, a component such as an accelerator column may be elongated along a beam axis to a length of one meter or more. Often an internal diameter of such a component may be on the order of a few hundred millimeters or less, rendering the component relatively inaccessible for cleaning.

With respect to these and other considerations the present disclosure is provided.

BRIEF SUMMARY

In one embodiment, a cleaning tool for cleaning a glass surface of an accelerator column is disclosed. The cleaning tool includes a shaft including a first end and a second end; a foam body located at the first end of the shaft; and a mounting bracket coupled to the first end of the shaft, the mounting bracket receiving the foam body. An outer circumference of the foam body includes a textured cleaning surface for contacting the glass surface of the accelerator column.

In another embodiment, a system includes an accelerator column and a cleaning tool for cleaning the glass surface of the accelerator column. The accelerator column includes a glass surface; a plurality of electrodes extending from the glass surface; and a plurality of electrode inserts. Each one of the electrode inserts of the plurality of electrode inserts is electrically and mechanically coupled to one of the electrodes of the plurality of electrodes, respectively. The plurality of electrode inserts being reversibly attachable to the plurality of electrodes, respectively. The cleaning tool includes a shaft including a first end and a second end; a foam body located at the first end of the shaft; and a mounting bracket coupled to the first end of the shaft. The mounting bracket receives the foam body. An outer circumference of the foam body includes a textured cleaning surface for contacting the glass surface of the accelerator column.

In a further embodiment, a method of maintaining an accelerator column is disclosed. The accelerator column including a plurality of electrodes and a plurality of electrode inserts. Each of the electrode inserts being coupled to one of the electrodes of the plurality of electrodes. The method includes removing one or more electrode inserts from an accelerator column; inserting a cleaning tool into the accelerator column; inserting a foam body located at an end of the cleaning tool in a space between adjacent electrodes of the plurality of electrodes; and rotating the cleaning tool to clean the space. The space being created at least partially by a void created as a result of removing one of the electrode inserts.

BRIEF DESCRIPTION OF THE DRAWINGS

FIG. 4A illustrates a detailed, perspective view of the cleaning tool shown in FIG. 3;

FIG. 4B illustrates an exploded, perspective view of a foam body and a mounting bracket of the cleaning tool shown in FIG. 3 according to embodiments of the disclosure;

FIG. 4C illustrates a bottom, perspective view of a shaft of the cleaning tool shown in FIG. 3 according to embodiments of the disclosure;

FIG. 4D illustrates a top, perspective view of a portion of the mounting bracket coupled to a first end of the shaft of the cleaning tool shown in FIG. 3 according to embodiments of the disclosure;

Figure 1:
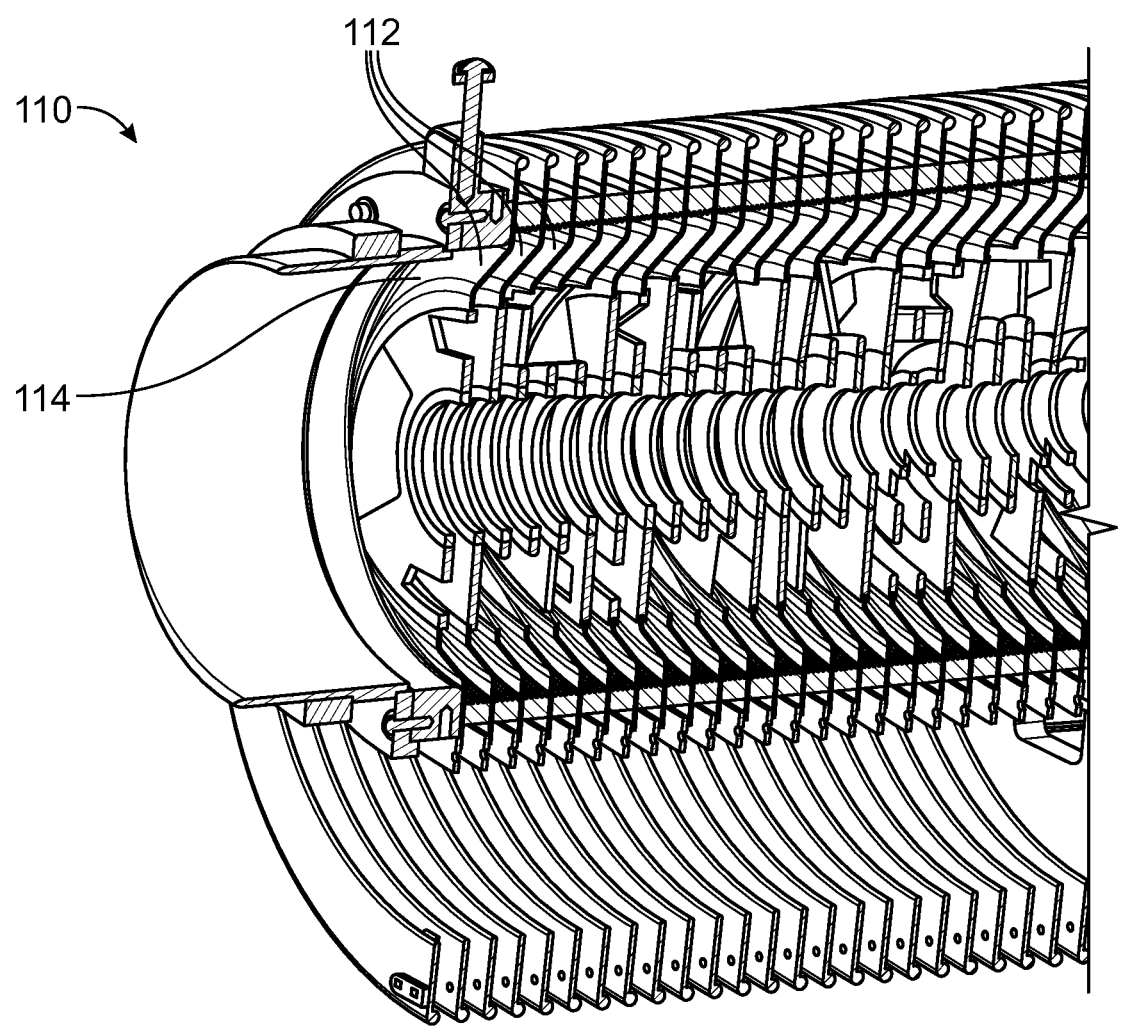
FIG. 1 illustrates a partial, perspective, cross-sectional view of an example embodiment of an accelerator column in a first state with a plurality of electrode inserts located therein.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments are related to operating and maintaining an apparatus having electrodes or other components, where such components may be reversibly attachable to the apparatus. Examples of the present embodiments involve ion beam processing apparatus such as beamline implanters. Various embodiments provide novel and improved electrode assemblies, as well as tools and methods for manipulating for manipulating electrode inserts. The present embodiments may be useful in beamline ion implanters where ion energy may range above 50 keV, and up to energies of 10 MeV, for example. The embodiments are not limited in this context.

FIG. 1 illustrates a perspective view of an accelerator column 110 in a first state. The accelerator column 110 may be an accelerator column, a decelerator column, or a combination of accelerator column/decelerator column in different embodiments. As such the accelerator column 110 may operate to manipulate an ion beam that is conducted through the accelerator column 110 according to known principles. The accelerator column 110 may include a plurality of electrodes, shown as electrodes 112, where these electrodes are used to establish varying potentials throughout the accelerator column, to manipulate ion beam potential to increase or decrease ion beam potential. Advantageously, in the first state, the accelerator column 110 may include a plurality of electrode inserts, where a given electrode insert, shown as electrode insert 114, is electrically and mechanically coupled to an electrode 112.

In use, the electrode insert 114 may be used for manipulating an ion beam in a beamline ion implanter. The electrode insert 114, when coupled with the electrode 112, may form an electrode structure that is used in an accelerator column having a plurality of electrodes (such as accelerator column 110), where the plurality of electrodes generate a series of different voltages, arranged to accelerate an ion beam to a target potential (voltage).

According to various embodiments, the electrode insert 114 may be reversibly attachable from the electrode 112, where the electrode 112 may be permanently or semi-permanently attached to the accelerator column 110. The term "reversibly attachable" as used herein means a component designed to be attached and detached from another component in a reversible manner. Notably, while not shown in FIG. 1, the electrode 112 may be affixed to the inside of the accelerator column 110. While the electrode 112 may remain affixed to the accelerator column 110, the electrode insert 114, being reversibly attachable, may be removed according for maintenance of, for example, the accelerator column 110. In the scenario in FIG. 1, the electrode insert 114 is connected mechanically and electrically to the electrode 112. Thus, the electrode insert 114 together with the electrode 112 act as an electrode component to guide an ion beam.

Figure 2B:
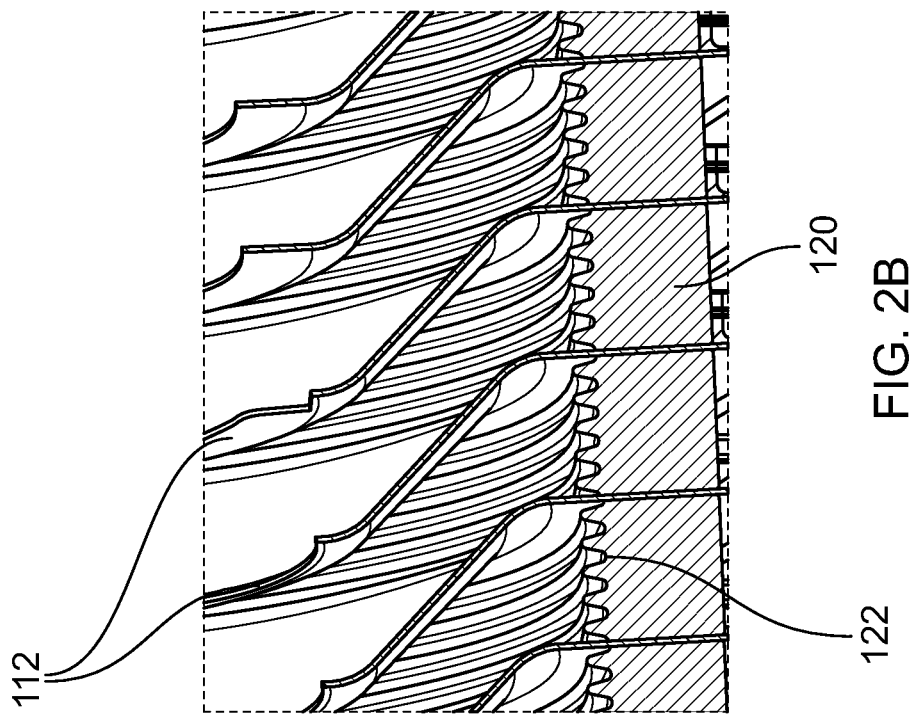
FIG. 2B illustrates a partial, detailed view of the accelerator column shown in FIG. 2A.
Figure 2A:
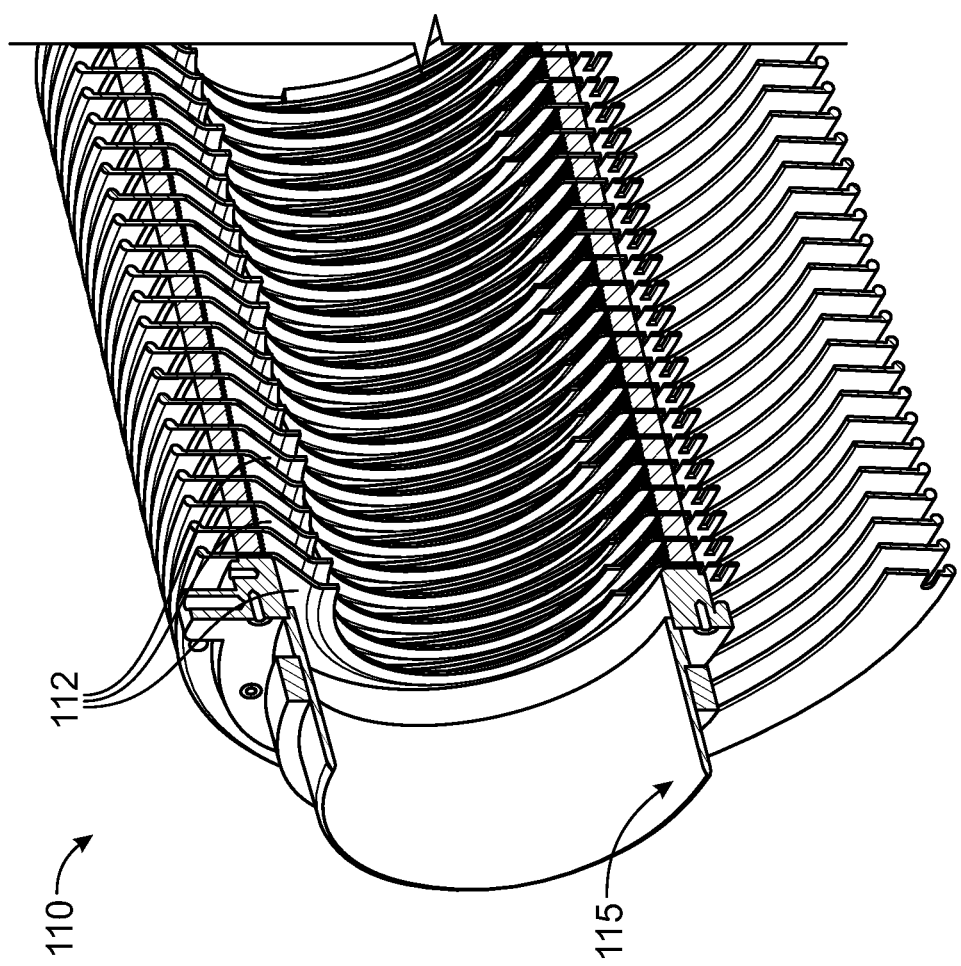
FIG. 2A illustrates a partial, perspective, cross-sectional view of an example embodiment of the accelerator column shown in FIG. 1 in a second state with the plurality of electrode inserts removed.

FIG. 2A illustrates a perspective view of the accelerator column 110 in a second state, where the electrode inserts 114 have been removed. FIG. 2B illustrates a detailed, perspective view of the accelerator column 110 in the second state with the electrode inserts 114 removed. In this configuration, the electrode insert 114 have been temporarily removed from the accelerator column 110 for maintenance of, for example, the accelerator column 110. That is, the electrode inserts 114 may be removed from the accelerator column 110 so that, for example, the accelerator column 110 may be cleaned. Thereafter, the electrode inserts 114 may be reinserted into the accelerator column 110.

As shown, by providing a removable electrode insert 114, the accelerator column 110 provides for easier maintenance of other portions, such as, for example, the glass surface 120 between adjacent electrodes 112. Notably, the electrodes 112 do not extend far from the cylindrical inner wall, shown as wall 115, of the accelerator column 110, providing better access for cleaning of the glass surfaces 120 of the accelerator column 110.

Advantageously, as detailed with respect to the embodiments to follow, a cleaning tool such as cleaning tool 100, may be employed to facilitate cleaning of the glass surface 120 that exists along the outer perimeter of the accelerator column 110. As shown, in-between adjacent electrodes 112, the glass surface 120 may include a plurality of grooves 122.

Figure 3:
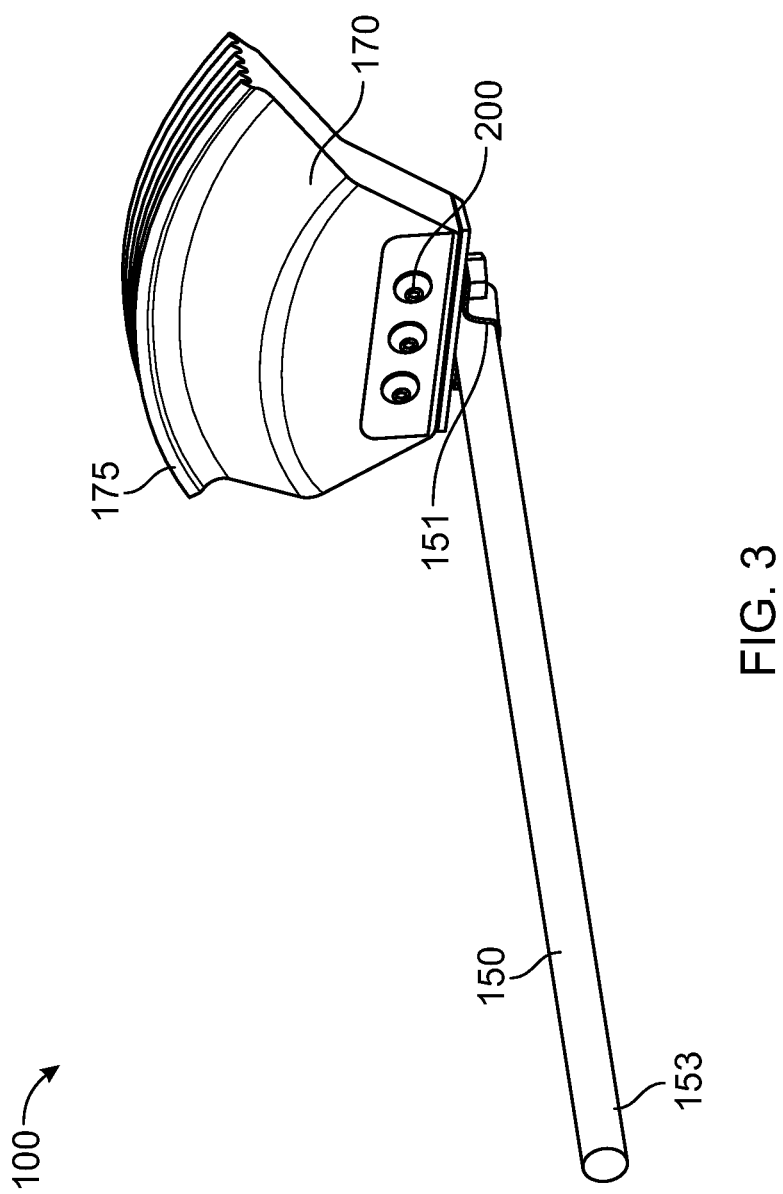
FIG. 3 illustrates a perspective view of a cleaning tool according to further embodiments of the disclosure.

FIG. 3 illustrates a perspective view of a cleaning tool 100 according to embodiments of the disclosure. As described below, the cleaning tool 100 is arranged and configured so that the cleaning tool 100 can be navigated between adjacent electrodes 112 to contact and clean the glass surface 120, including the grooves 122 formed in the glass surface 120. As illustrated, the cleaning tool 100 may include a shaft 150, where the shaft may have a first end 151 and a second end 153. The shaft 150 may include a shaft length of any length and may exceed 300 mm in some embodiments. The shaft 150 maybe made of a material such as aluminum in some embodiments. Among other considerations, the shaft length for cleaning tool 100 may be designed per the size or length of the accelerator column 110 to be serviced. The cleaning tool 100 may also include a foam body 170 for contacting and cleaning the glass surface 120 of the accelerator column 110. The foam body 170 may be affixed to the first end 151 of the shaft 150. As will be described in greater detail below, the foam body 170 may be made from a polyethylene foam. In addition, the foam body 170 may include a cleaning surface 175 for contacting the glass surface 120. The cleaning surface 175 may be made from a semiconductor qualified material used for cleaning the glass surface 120, such as, for example, Sahara® buffing pad manufactured by Foamtec, a specially cross-linked ester, polyurethane foam.

The second end 153 of the shaft 150 may be connected to a handle (not shown) or other component to provide advantageous and convenient manipulation of the shaft 150. For example, in FIG. 3, the shaft 150 may be deemed to define a shaft axis parallel to the longitudinal direction of the shaft 150, where rotation of the shaft 150 about the shaft axis is used to clean the surface of the glass surface 120. The foam body 170 may be rigidly affixed to the shaft 150 so that rotation of the shaft 150 causes rotation of the foam body 170. Accordingly, when the cleaning tool 100 is appropriately positioned between adjacent electrodes 112, rotation of the shaft 150 may cause rotation of the foam body 170 against the glass surface 120, thus cleaning the glass surface 120.

In various embodiments, the shaft 150 may be rigidly connected to the foam body 170 by using any mechanism now known or hereafter developed. In one embodiment, the shaft 150 may be coupled to the foam body 170 using a simple coupling device. Referring to FIGS. 4A-4D, for example, the first end 151 of the shaft 150 may include a flat surface 152 for receiving a portion of a mounting bracket 200 used to couple the foam body 170 to the first end 151 of the shaft 150. As shown, the mounting bracket 200 may include a first bracket 202 and a second bracket or mounting plate 204 for coupling the foam body 170 therebetween. In one embodiment, the first bracket 202 may include a first leg 206 and a second leg 208, the second leg 208 being positioned approximately perpendicular to the first leg 206 so that the first bracket 202 has an approximate L-shape. In this manner, the second leg 208 may be coupled to the first end 151 of the shaft 150. For example, as shown, the second leg 208 of the first bracket 202 may be coupled to the first end 151 of the shaft 150 via a fastener or rivet 209 passing thru an opening (not shown) formed in the flat surface 152 on the shaft 150. In addition, the second leg 208 of the first bracket 202 may be coupled to the first end 151 of the shaft 150 via a strap or other mechanism 210 using fasteners or rivets 212 passing through holes 214 formed in the second leg 208 of the first bracket 202. Meanwhile each of the first leg 206 of the first bracket 202, the mounting plate 204, and the foam body 170 may include a plurality of holes 216 for receiving fasteners or rivets 212 for coupling to the foam body 170 to the mounting bracket 200. This coupling allows the foam body 170 to be removably coupled to the shaft 150. In this manner, the foam body 170 can be replaced. Alternatively, the coupling allows a user to conveniently adjust the length of the cleaning tool 100 by choosing a shaft 150 of the appropriate length, and connecting or disconnecting the chosen shaft 150 to the foam body 170 through the simple coupling device.

Figure 5B:
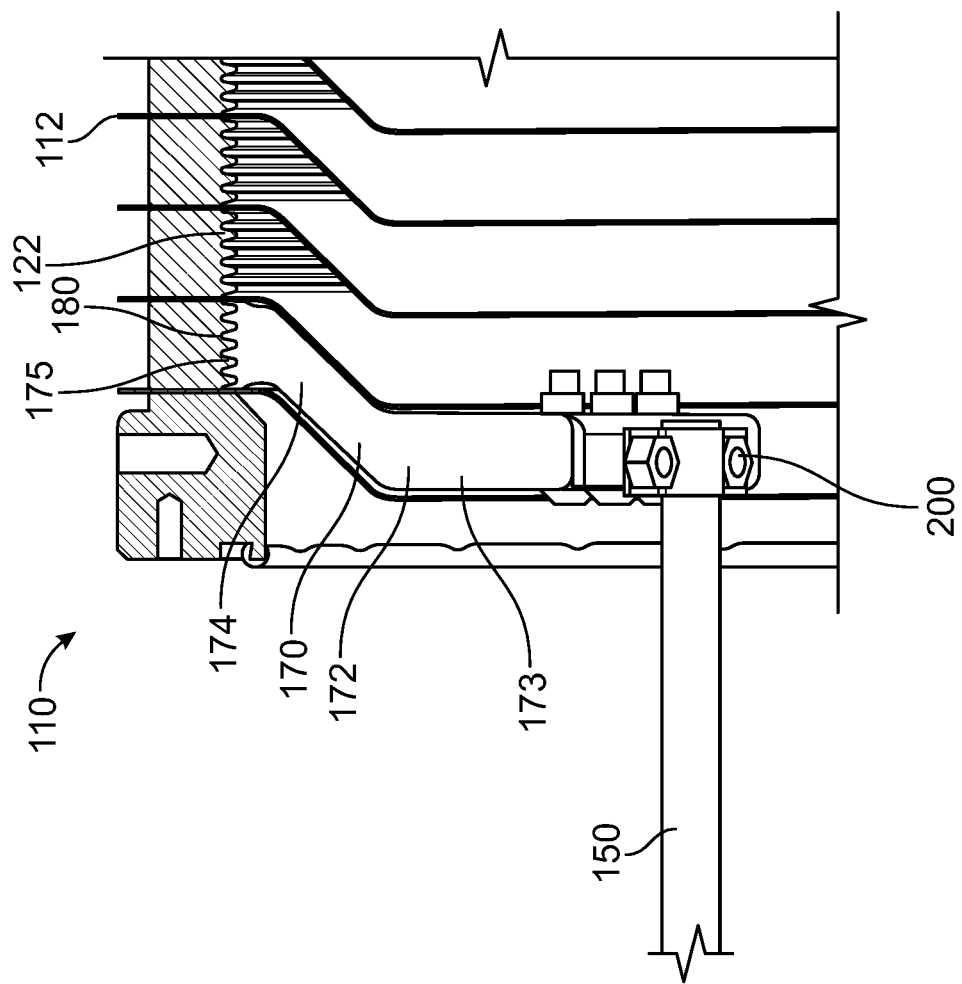
FIG. 5B illustrates a partial, cross-sectional side view of the foam body of the cleaning tool shown in FIG. 3 inserted in-between adjacent electrodes of the accelerator column according to embodiments of the disclosure.
Figure 5A:
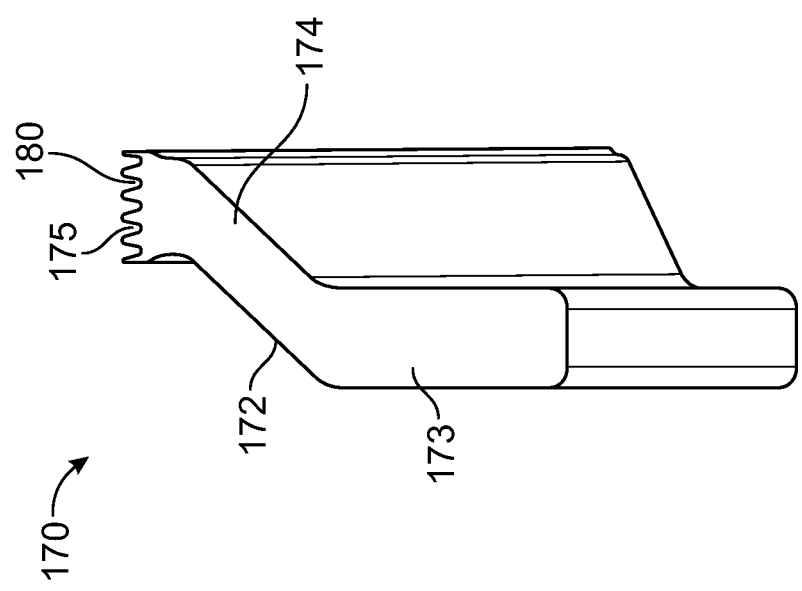
FIG. 5A illustrates a side view of the foam body of the cleaning tool shown in FIG. 3 according to embodiments of the disclosure.

Referring to FIGS. 5A and 5B, the foam body 170 may have the general appearance of a fan blade, although other shapes are envisioned including, but not limited to, semi-circular, etc. As previously mentioned, the foam body 170 may include a cleaning surface 175 on the outer circumferential surface thereof. The cleaning surface 175 may be made from a semiconductor qualified material used for cleaning the glass surface 120, such as, for example, Sahara® buffing pad manufactured by Foamtec, a specially cross-linked ester, polyurethane foam. In addition, the cleaning surface 175 preferably includes a textured cleaning surface such as, for example, a plurality of serrations 180 for contacting and cleaning the grooves 122 formed in the glass surface 120 of the accelerator column 110.

The foam body 170 may also include a body portion 172 that includes a first segment 173 and a second segment 174. The second segment 174, which segment interconnects the cleaning surface 175 to the first segment 173, may be angled with respect to the first segment 173. In this manner, the foam body 170 has a shape that mimics the space between adjacent electrodes 112 in the accelerator column 110, when the electrode inserts 114 are removed. The body portion 172 of the foam body 170 may be made from a polyethylene foam. Alternatively, the body portion 172 may be made from other suitable materials such as, for example, polyurethane. In this manner, in use, the foam body 170 is compressible enough so that the foam body 170 can deform as the foam body 170 is being inserted in-between adjacent electrodes 112 to reach the glass surface 120. In addition, the serrations 180 formed on the cleaning surface 175 of the foam body 170 can be compressed into the grooves 122 formed on the glass surface 120. The serrations 180 formed on the cleaning surface 175 of the foam body 170 are rigid enough so that the compressive forces being applied can be transferred from the shaft 150, through the foam body 170 to the cleaning surface 175. In this manner, the serrations 180 can clean any ion deposits on the glass surface 120 and the grooves 122 formed in the glass surface 120. The cleaning surface 175 may be coupled to the body portion 172 by any means now known or hereafter developed including, for example, an adhesive or glue.

In one embodiment, the foam body 170 may have a thickness of approximately 0.65 inches, a height of approximately 4 inches and a width (at the cleaning surface 175) of approximately 6 inches. In this manner, the foam body 170 can fit in-between adjacent electrodes 112 without the shaft 150 or mounting bracket 200 contacting the electrodes 112. Yet, the foam body 170 is still able to contact and clean the glass surface 120. These dimensions are merely examples, and other dimension may be used.

Notably, any number of electrode inserts 114 may be withdrawn. Subsequently, maintenance (e.g., cleaning) may be performed on the accelerator column 110, while at least one electrode insert 114 is removed. Subsequently, an electrode insert 114 may be reinstalled into the accelerator column 110.

Figure 6:
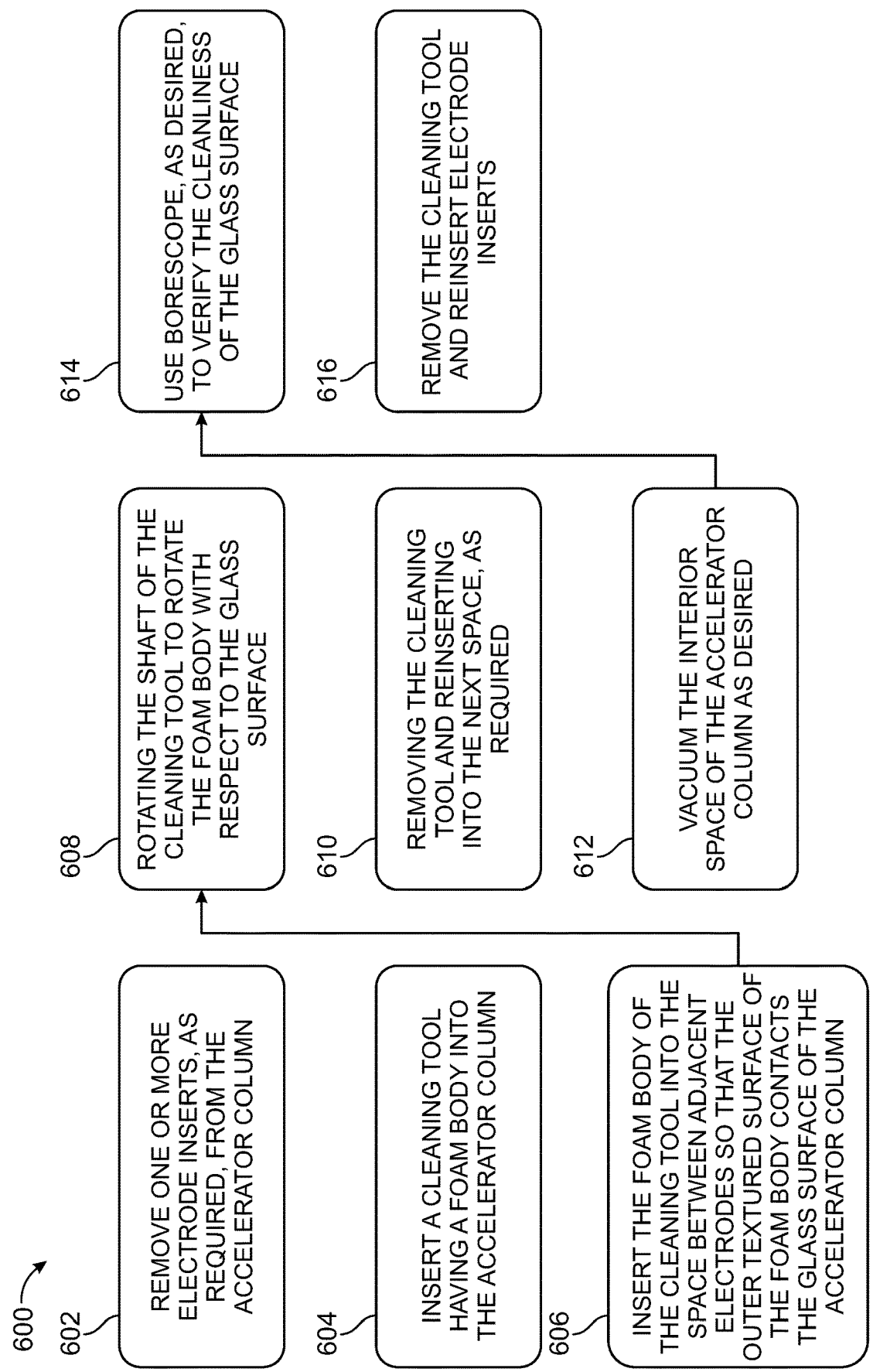
FIG. 6 provide an exemplary process flow according to some embodiments of the disclosure.

FIG. 6 depicts an exemplary process flow 600. At block 602, an electrode insert 114 is provide in an accelerator column 110. The electrode insert 114 may be connected to an electrode 112, among a plurality of electrodes 112 in the accelerator column 110. The electrode insert 114 may be reversibly attachable to the electrode 112. In the first instance, one or more electrode inserts 114 may be removed from the accelerator column 110. In one embodiment, all the electrode inserts 114 may be removed one at a time.

At block 604, the cleaning tool 100 may be inserted into the accelerator column 110. Care should be taken to ensure that the shaft 150 and mounting bracket 200 do not contact the electrodes 112.

At block 606, the cleaning tool 100 is inserted into the space or void in-between adjacent electrodes 112, the space being partially created at least partially as a result of the electrode insert 114 being removed. The cleaning tool 100 is inserted into the space to scrub the inside surface of the grooved glass surface 120 between electrodes 112. That is, after being properly positioned between adjacent electrodes 112, the foam body may be pushed into the space between adjacent electrodes 112. The foam body 170 may deform to fit within the space between adjacent electrodes until the cleaning surface 175 contacts the glass surface 120 with the textured cleaning surface (e.g., serrations 180) formed on the outer circumference of the foam body 170 being in contact with the grooves 122 formed in the glass surface 120.

At block 608, after being properly inserted between adjacent electrodes 112 with the cleaning surface 175 of the cleaning tool 100 contacting the grooved glass surface 120 of the accelerator column 110, the cleaning tool 100 is rotated about its longitudinal axis in a first direction, such as a counterclockwise direction (or clockwise direction). The cleaning surface 175 contacts and scrubs the glass surface 120 and the grooves 122 formed in the glass surface 120 to remove any unwanted ion deposits.

At block 610, in one embodiment, upon completion of cleaning the glass surface 120 between electrodes 112, the cleaning tool 100 is removed and inserted in-between the next set of adjacent electrodes 112. In this manner, the glass surface 120 can be sequentially cleaned. In one embodiment, the grooved glass surface 120 is cleaned from the back to front of the accelerator column 110.

At block 612, a vacuum may be used, preferably continuously, to remove any excess material throughout the process.

At block 614, a borescope may also be used to verify the cleanliness of the glass surface 120.

At block 616, upon completion of the cleaning process, the cleaning tool 100 may be removed and the electrode inserts 114 may be reinserted into the accelerator column 110. Alternatively, new electrode inserts or refurbished electrode inserts may be inserted.

During the cleaning process, the user's gloves should be consistently checked to ensure that there are no tears throughout the process to ensure that no additional contaminants are introduced into the accelerator column 110.

There are multiple advantages provided by the present embodiments, including the advantage of the ability to conveniently clean the glass surface 120 located on the outer perimeter of the accelerator column 110, where the glass surface 120 is not otherwise manually accessible. Additionally, the present embodiments provide another advantage in the ability to maintain accelerator columns, regardless of the depth of the accelerator column, by providing a modular cleaning tool where the length of the cleaning tool can be readily increased by simple replacement of the shaft.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of maintaining an accelerator column, wherein the accelerator column comprises a plurality of electrodes and a plurality of electrode inserts, and wherein each of the electrode inserts is coupled to one of the electrodes of the plurality of electrodes, the method comprising:

removing one or more electrode inserts from the accelerator column inserting a cleaning tool into the accelerator column;

inserting a foam body located at an end of a shaft of the cleaning tool into a space between adjacent electrodes of the plurality of electrodes, the space being created at least partially by a void created as a result of removing one of the electrode inserts, wherein an outer circumference of the foam body includes a textured cleaning surface for contacting a glass surface of the accelerator column, and wherein the textured cleaning surface includes a plurality of curved serrations extending along a curvature of the textured cleaning surface for contacting a plurality of grooves formed in the glass surface; and rotating the cleaning tool to clean the space.

2. The method of claim 1, wherein inserting the foam body in the space between adjacent electrodes includes compressing the foam body to match a shape of the space so the outer circumference of the foam body contacts the glass surface in the accelerator column.

3. The method of claim 2, wherein rotating the cleaning tool to clean the space includes rotating the textured cleaning surface on the outer circumference of the foam body so that the textured cleaning surface scrubs the glass surface.

4. The method of claim 1, wherein rotating the cleaning tool comprises rotating the cleaning tool about a longitudinal axis of the cleaning tool.

5. The method of claim 1, further comprising:

removing the cleaning tool from the space; and inserting the foam body into a second space between adjacent electrodes.

6. The method of claim 5, wherein the accelerator column is sequentially cleaned from a back to a front of the accelerator column.

7. The method of claim 1, further comprising vacuuming an interior space of the accelerator column to remove any excess material.

8. The method of claim 1, further comprising using a borescope to verify a level of cleanliness of a glass surface in the accelerator column.

9. The method of claim 1, further comprising inserting one or more electrode inserts, each of the inserted one or more electrode inserts being coupled to one of the electrodes of the plurality of electrodes.

10. The method of claim 1, further comprising inserting one or more new electrode inserts into the accelerator column, each of the new electrode inserts being coupled to one of the electrodes of the plurality of electrodes.

11. The method of claim 1, further comprising inserting one or more refurbished electrode inserts into the accelerator column, each of the refurbished electrode inserts being coupled to one of the electrodes of the plurality of electrodes.

* * * * *